US010498300B2

(12) United States Patent
Schulz

(10) Patent No.: US 10,498,300 B2
(45) Date of Patent: Dec. 3, 2019

(54) VOLTAGE-TO-CURRENT TRANSCONDUCTANCE OPERATIONAL AMPLIFIER WITH ADAPTIVE BIASING

(71) Applicant: Power Integrations, Inc., San Jose, CA (US)

(72) Inventor: Frank Joseph Schulz, Ottawa (CA)

(73) Assignee: Power Integrations, Inc., San Jose, CA (US)

( * ) Notice: Subject to any disclaimer, the term of this patent is extended or adjusted under 35 U.S.C. 154(b) by 378 days.

(21) Appl. No.: 15/651,733

(22) Filed: Jul. 17, 2017

(65) Prior Publication Data
US 2019/0020323 A1 Jan. 17, 2019

(51) Int. Cl.
| H03F 3/45 | (2006.01) |
| H03G 3/30 | (2006.01) |
| H03F 3/347 | (2006.01) |
| G05F 3/26 | (2006.01) |
| H03G 5/22 | (2006.01) |
| G05F 3/22 | (2006.01) |

(52) U.S. Cl.
CPC .......... *H03F 3/45179* (2013.01); *G05F 3/22* (2013.01); *G05F 3/26* (2013.01); *H03F 3/347* (2013.01); *H03F 3/45273* (2013.01); *H03G 3/3042* (2013.01); *H03G 3/3084* (2013.01); *H03G 5/22* (2013.01); *H01L 2924/13091* (2013.01); *H03G 2201/40* (2013.01)

(58) Field of Classification Search
CPC ......... G05F 3/26; H03G 3/3084; H03F 3/347; H03F 3/45–45995
See application file for complete search history.

(56) References Cited

U.S. PATENT DOCUMENTS

| 5,282,107 | A | | 1/1994 | Balakrishnan | |
| 5,382,838 | A | * | 1/1995 | Sasaki | H03F 3/3001 326/30 |
| 5,635,880 | A | * | 6/1997 | Brown | H03B 5/24 330/253 |
| 6,469,579 | B2 | * | 10/2002 | Bazes | H03F 3/45192 330/253 |
| 6,704,560 | B1 | * | 3/2004 | Balteanu | H03F 1/3211 330/257 |
| 7,295,451 | B2 | | 11/2007 | Donald | |

(Continued)

*Primary Examiner* — Thienvu V Tran
*Assistant Examiner* — Christopher J Clark
(74) *Attorney, Agent, or Firm* — The Law Offices of Bradley J. Bereznak

(57) ABSTRACT

An IC for power conversion includes bias circuitry that generates one or more bias voltages. An adaptive biasing circuit adaptively shifts an input signal having a negative value to a positive value. An operational transconductance amplifier (OTA) receives a supply bias current and the first and second bias voltages. The OTA has first and second input terminals coupled to the input signal and ground, respectively. The OTA has first and second transistors coupled to the first and second input terminals through first and second resistors at first and second internal nodes, respectively. Additional circuitry of the OTA is coupled to the second internal node. The additional circuitry insures that the voltage at the second internal node follows the voltage at the first internal node. The OTA generates an output current signal responsive to a differential input voltage applied across the first and second input terminals.

19 Claims, 2 Drawing Sheets

(56) References Cited

U.S. PATENT DOCUMENTS

| | | | |
|---|---|---|---|
| 7,494,875 B2 | 2/2009 | Disney | |
| 7,585,719 B2 | 9/2009 | Balakrishnan | |
| 7,695,523 B2 | 4/2010 | Corradini et al. | |
| 7,786,803 B2 * | 8/2010 | Willassen | H03F 3/3022 323/315 |
| 8,115,457 B2 | 2/2012 | Balakrishnan et al. | |
| 9,106,089 B2 * | 8/2015 | Zhang | H02J 7/0052 |
| 9,148,929 B2 | 9/2015 | Jiang et al. | |
| 9,641,127 B1 * | 5/2017 | Xu | H04B 10/564 |
| 2003/0109335 A1 | 6/2003 | Gan et al. | |
| 2003/0201821 A1 | 10/2003 | Coady | |
| 2004/0041607 A1 * | 3/2004 | Pan | G11C 7/1051 327/170 |
| 2004/0041622 A1 | 3/2004 | Wu | |
| 2005/0001681 A1 * | 1/2005 | Chen | H03F 3/345 330/253 |
| 2005/0035371 A1 | 2/2005 | Fujihira | |
| 2005/0167749 A1 | 8/2005 | Disney | |
| 2007/0035286 A1 | 2/2007 | Lee et al. | |
| 2008/0136523 A1 * | 6/2008 | Chiu | H03F 3/45183 330/261 |
| 2008/0252376 A1 * | 10/2008 | Miao | H03F 1/14 330/277 |
| 2008/0259653 A1 | 10/2008 | Baurle et al. | |
| 2009/0016090 A1 | 1/2009 | Knight | |
| 2009/0040795 A1 | 2/2009 | Park et al. | |
| 2009/0261790 A1 | 10/2009 | Arduini | |
| 2010/0109561 A1 | 5/2010 | Chen et al. | |
| 2011/0025278 A1 | 6/2011 | Balakrishnan et al. | |
| 2011/0149615 A1 | 6/2011 | Matthews | |
| 2011/0194445 A1 | 8/2011 | Riddington et al. | |
| 2012/0028083 A1 | 2/2012 | Jung | |
| 2012/0074896 A1 | 3/2012 | Lui et al. | |
| 2012/0139638 A1 * | 6/2012 | Kaviani | H03F 3/45183 330/289 |
| 2013/0020964 A1 | 1/2013 | Nuhfer et al. | |
| 2013/0188401 A1 | 7/2013 | Jin | |
| 2014/0285265 A1 * | 9/2014 | Papamichail | H03F 3/16 330/261 |
| 2014/0340065 A1 | 11/2014 | Svorc et al. | |
| 2015/0256135 A1 * | 9/2015 | Coimbra | H03F 3/3016 330/253 |
| 2017/0005622 A1 * | 1/2017 | Fitzi | H03F 1/26 |
| 2018/0102768 A1 * | 4/2018 | Harada | H04N 5/374 |
| 2018/0275703 A1 * | 9/2018 | Hamlyn | G05F 1/575 |
| 2018/0342994 A1 * | 11/2018 | Zamprogno | H03F 1/0205 |

* cited by examiner

VOLTAGE-TO-CURRENT TRANSCONDUCTANCE OPERATIONAL AMPLIFIER WITH ADAPTIVE BIASING

TECHNICAL FIELD

This application relates generally to electronic amplifiers and integrated circuits for implementing the same; more specifically, to an operational transconductance amplifier (OTA) device that converts a differential input voltage into an output current.

BACKGROUND

Operational amplifiers are commonly utilized in electronic circuits to process analog signals. An operational amplifier is often used in integrated circuits that modify analog signals in a particular way, such for example changing amplitudes, filtering frequency components, or performing linear mathematical operations that may include summing with other signals, integration, and differentiation.

Direct current (DC) signals are often used as analog representations of measurements (such as sensed electrical signals from different nodes of a power converter or other circuitries or in other examples sensing/measuring temperature, pressure, flow, weight or motion). Often times, DC current signals are used in preference to DC voltage signals. This is because current signals are substantially equal in magnitude throughout a series circuit loop carrying current from the source (measuring device) to the load (indicator, recorder, or controller), whereas voltage signals in a parallel circuit may vary from one end to the other due to resistive wire losses. Furthermore, current-sensing instruments typically have low impedances, whereas voltage-sensing instruments typically have high impedances; that means that current-sensing instruments generally have greater electrical noise immunity.

An operational transconductance amplifier (OTA) is a well-known amplifier whose differential input voltage produces an output current. Thus, it is a voltage controlled current source (VCCS). Transconductance is an electrical characteristic relating the current through the output of a device to the voltage across the input of a device. That is, conductance is the reciprocal of resistance. Voltage-to-current converting OTAs are utilized in many electronic circuits. For example, OTAs may be used in instrumentation circuitry and in integrated circuit (IC) controllers that are required for operation of switched-mode power converters that power electronic devices such as laptop computers, televisions, etc.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1A:
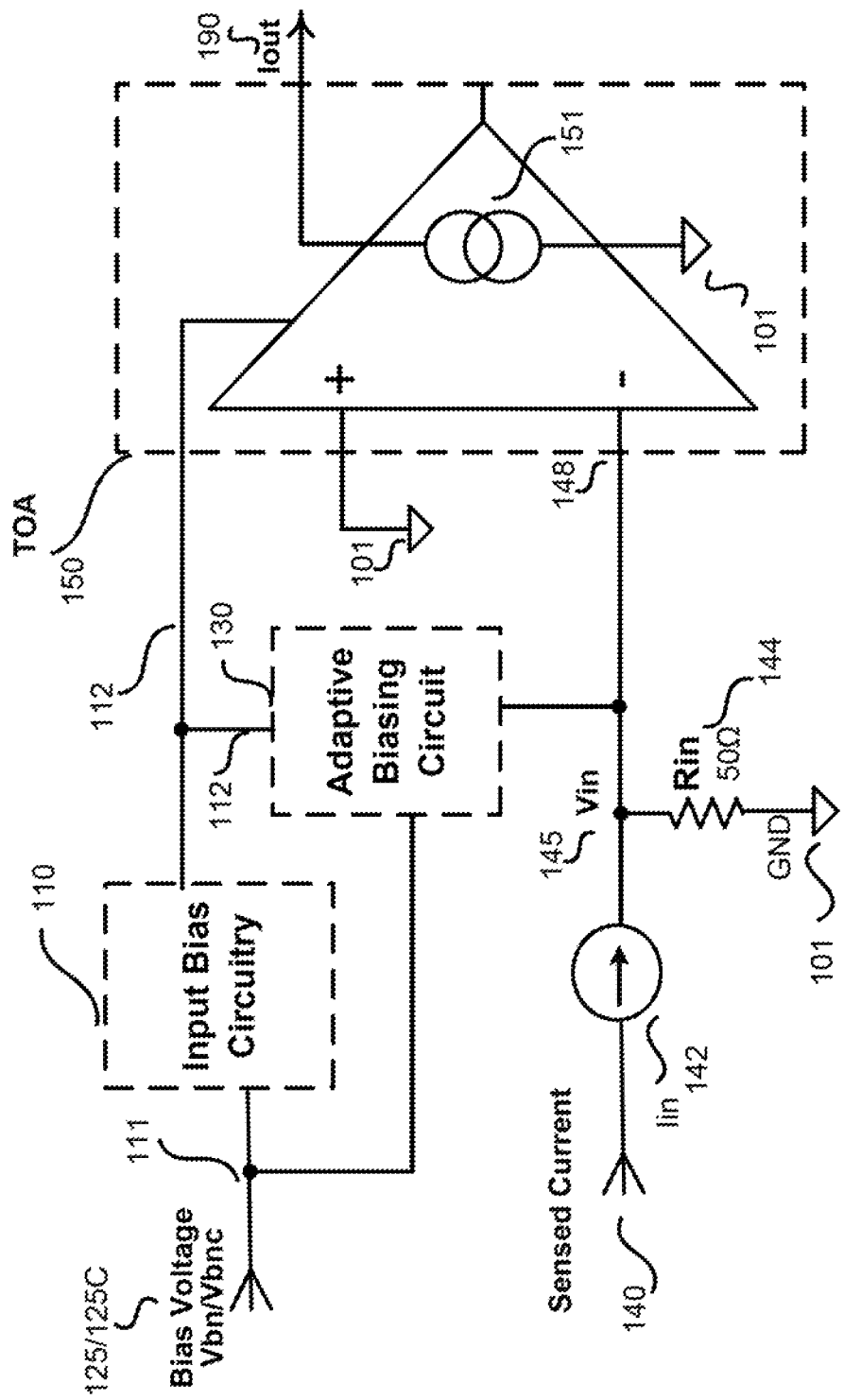
FIG. 1A is a circuit block diagram of an example operational transconductance amplifier circuit with adaptive biasing.

Corresponding reference characters indicate corresponding components throughout the several views of the drawings. Skilled artisans will appreciate that elements in the figures are illustrated for simplicity and clarity and have not necessarily been drawn to scale. Also, common but well-understood elements that are useful or necessary in a commercially feasible embodiment are often not depicted in order to facilitate a less obstructed view of these various disclosed embodiments.

DETAILED DESCRIPTION

In the following description specific details are set forth, such as device types, voltages, component values, circuit configurations, etc., in order to provide a thorough understanding of the embodiments described. However, persons having ordinary skill in the relevant arts will appreciate that these specific details may not be needed to practice the embodiments described. It is further appreciated that well known circuit structures and elements have not been described in detail, or have been shown in block diagram form, in order to avoid obscuring the embodiments described.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or sub-combinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art.

In the context of the present application, when a transistor is in an "off state", or "off", the transistor does not substantially conduct current. Conversely, when a transistor is in an "on state", or "on", the transistor is able to substantially conduct current. By way of example, in one embodiment, a power transistor comprises an N-channel metal-oxide-semiconductor field-effect transistor (NMOS) with the high-voltage being supported between the first terminal, a drain, and the second terminal, a source. The high voltage MOSFET comprises a power switch that is driven by an integrated controller circuit to regulate energy provided to a load. For purposes of this disclosure, "ground" or "ground potential" refers to a reference voltage or potential against which all other voltages or potentials of an electronic circuit or Integrated circuit (IC) are defined or measured.

The present disclosure is directed to a voltage-to-current converter circuit and method of operation thereof. In one embodiment, an operational transconductance amplifier (OTA) is utilized in conjunction with input circuitry and an adaptive biasing circuit that adaptively shifts a negative input signal to a level that is shifted above ground (zero volts). The shifted signal is processed by the OTA. Thus, the converter circuit is capable of sensing input signals that may extend both above and below ground (oscillating positive/negative). A low impedance resistor between the input and ground may be included to provide current-to-current translation from the milliamp to the microampere range for further processing within an integrated circuit (IC) or chip package.

Persons of skill in the art will appreciate that the voltage-to-current converter disclosed herein advantageously provides for sensing of both positive and negative input signals; utilization of NMOS devices, as opposed to PMOS that typically require a higher back bias; less electrostatic discharge (ESD) susceptibility; a relatively wide input signal range (e.g., ±1 V); and improved noise rejection.

In an example application, a power supply uses a current sense leg of a power FET to provide a fraction of the switching current (e.g., in tens of mAs) into a current sense resistor located between the FET and ground. The current sense resistor may be 50 ohms or less. The voltage developed across the current sensing resistor provides an input voltage signal through an adaptive biasing circuit to a voltage-to-current (V-to-I) converter. In one implementation, the V-to-I converter is configured to handle the input voltage signals in the range of from +1 V down to −0.5 V. In one example, the power converter circuit includes ESD diodes that turn-on at a voltage of approximately −0.5 V.

In one example, level shifters in an adaptive biasing circuit utilize PMOS devices coupled as voltage followers for sensing and shifting voltage signals that are below ground to be transferred to a more suitable range within the power supply rail voltage of the IC. The adaptive biasing circuit is configured to adaptively shift any negative input signal to a shifted level above zero (above ground), which may then be processed by the V-to-I converter. Adaptive biasing reduces power consumption and increases efficiency.

FIG. 1A is a circuit block diagram of an example operational transconductance amplifier circuit with adaptive biasing. As shown, an input voltage signal Vin 145 is provided by a voltage drop across an input resistor $R_{in}$ 144 due to a sensed current signal 140 from a power switch in a switching circuit/converter. Sensed current 140 is shown symbolically by current source $I_{in}$ 142. Note that the voltage drop across input resistor $R_{in}$ 144 generates input voltage signal Vin 145 referenced to ground 101. Input resistor $R_{in}$ 144, in one example, is a relatively small (e.g., 50 ohm) resistor. Input voltage signal Vin 145 is coupled to the negative input 148 of voltage-to-current operational transconductance amplifier (V-to-I TOA) 150, and also to an adaptive biasing circuit 130. Adaptive biasing circuit 130 is configured to adaptively bias and level shift input signal $V_{in}$ 145 such that negative oscillations on input signal $V_{in}$ 145 become positive in reference to ground. In one example, sensed current 140 is a very small fraction of switch current sensed through a sense FET integral with a power switch.

The circuit block diagram of FIG. 1A also shows bias voltages $V_{bn}/V_{bnc}$ 125/125C provided at node 111 coupled to input bias circuitry 110 and adaptive biasing circuit 150. Input bias circuitry 110 provides the supply and bias voltage ($V_{bp}$, $V_{bpc}$) at supply line 112 for low-side and high-side CMOS switches included in the circuitry of V-to-I OTA 150. V-to-I OTA 150 produces an output current signal $I_{OUT}$ 190 responsive to the differential input voltage applied to the positive and negative input terminals of V-to-I OTA 150. Note that in the example shown the positive input terminal of V-to-I OTA 150 is connected to ground 101. Output current signal $I_{OUT}$ 190 may optionally be scaled by device size scaling of transistors 184 & 188 to provide a properly scaled current signal $I_{out}$ 190 for the sense and detect circuitries of the IC.

Figure 1B:
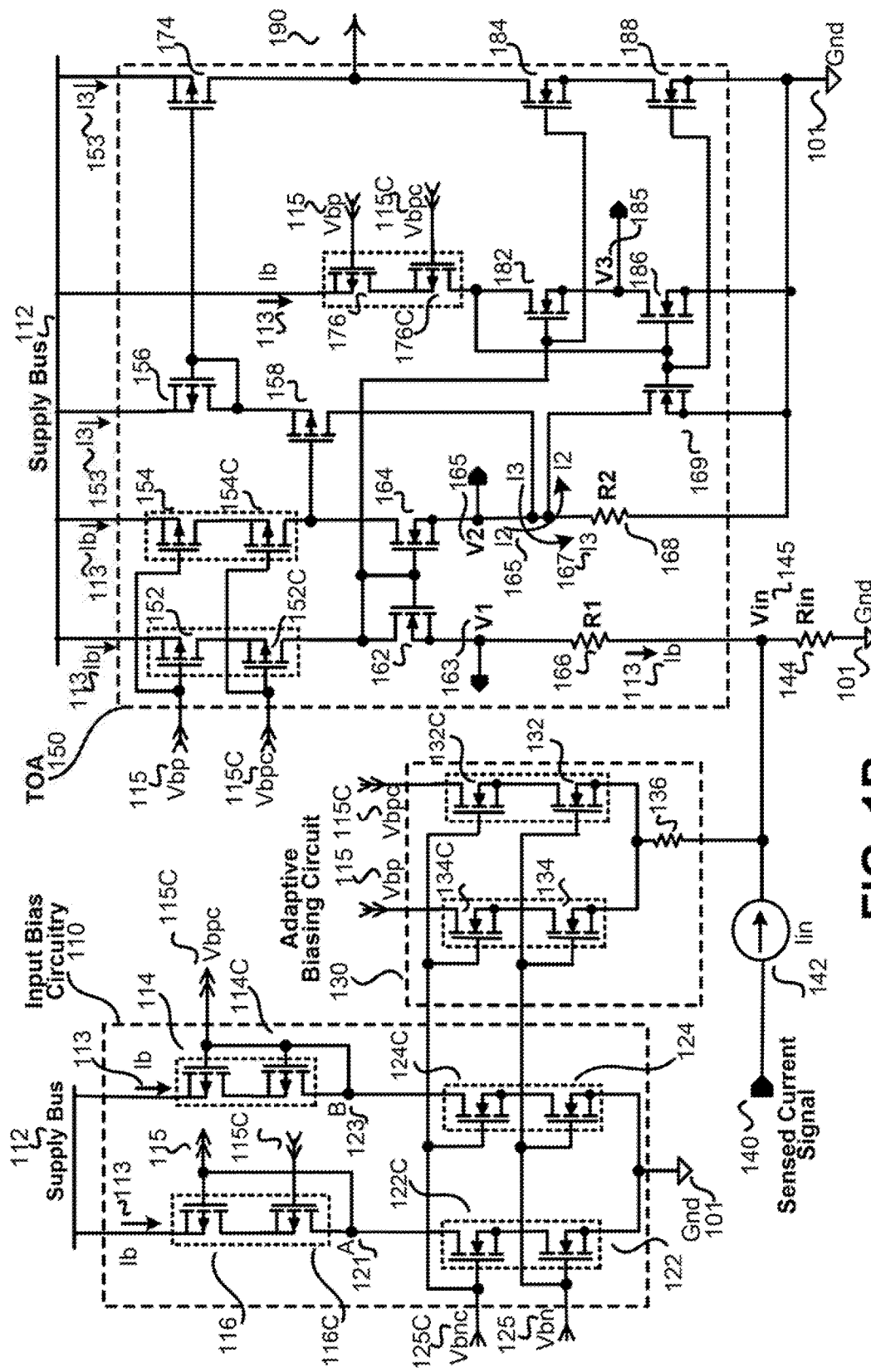
FIG. 1B is a detailed circuit schematic diagram of the operational transconductance amplifier circuit with adaptive biasing shown in FIG. 1A.

FIG. 1B is a detailed circuit schematic diagram of the operational transconductance amplifier circuit with adaptive biasing shown in FIG. 1A. The power converter circuit shown in FIG. 1B includes the three main blocks shown in FIG. 1A; namely, input bias circuitry 110, adaptive biasing circuit 130, V-to-I OTA 150.

Input bias circuitry 110 generates the bias input voltage for the high-side PMOS switches P1 152, P1C 152C, P2 154 and P2C 154C in V-to-I OTA 150. Input bias circuitry 110 includes two switching legs with parallel current sharing operation. It is appreciated that each of the two series-coupled cascode structure switches (e.g., PMOS transistors $P_{in1}$ 116 and $P_{in1C}$ 116C, at the high-side of the first current leg/branch and NMOS cascode transistor $N_{in1}/N_{in1C}$ 122/122C, at the low-side of first current leg/branch) may include an optional cascode structure that provides high accuracy in current mirroring. In the example of FIG. 1B the cascode structure of high-side and low-side elements is repeated in other legs as well and are framed in the smaller dotted rectangles to distinguish the cascode switch structure (CSS). It is appreciated that in other examples/embodiment these low-side and high-side switching elements may include other types of single transistors and/or discrete switches.

As shown, the low-side cascode-pair NMOS transistors $N_{in1}/N_{in1C}$ 122/122C (in the first current leg/branch) as well as cascode-pair NMOS transistors $N_{in2}/N_{in2C}$ 124/124C (in the second current leg/branch) are referenced to ground 101 and are driven by external bias supplies $V_{bn}$ 125 & $V_{bnc}$ 125C.

High-side cascode-pair PMOS transistors $P_{in2}/P_{in2C}$ 114/114C (at the high-side of the second current leg/branch) are configured to function as a diode. In other words, the gates of $P_{in2C}$ 114C and $P_{in2}$ 114 are coupled to the drain of the high-side PMOS cascode-pair that is also coupled to the drain of the low-side cascode-pair NMOS switching element at node B 123. The source of cascode-pair PMOS transistors $P_{in1}/P_{in1C}$ 116/116C (at the high-side of first current leg/branch) is the same as the source of cascode-pair PMOS transistor $P_{in2}$ 114/$P_{in2C}$ 114C (at the high-side of second current leg/branch), both of which are coupled to a current (or voltage) supply $I_{sup}$ 112, with each receiving a current $I_b$ 113 (e.g., 2.5 µA). The voltage at node B 123 provides bias for cascode-pair PMOS transistors $P_{in2}/P_{in2C}$ 114/114C as well as bias voltage $V_{bpC}$ 115C for certain other transistors in the circuit. Voltage $V_{bpC}$ 115C biases transistor $P_{in1C}$ 116C and the voltage at node A 121 may provide bias $V_{bp}$ 115 for transistor $P_{in1}$ 116 and for certain other transistors in the circuit schematics of FIG. 1B.

Bias voltages $V_{bn}$ 125 and $V_{bnC}$ 125C (for cascode-pair NMOS transistors) from input bias circuitry block 110 are also coupled to adaptive biasing circuit block 130. Adaptive biasing circuit block 130 includes two current sharing legs with cascode-pair NMOS transistors $N_A/N_{AC}$ 134/134C in first leg, and cascode-pair NMOS transistors $N_B/N_Bc$, 132/132C in second leg which are scaled to 1/k (e.g., k=5) of the size of the low-side NMOS transistors in input bias circuitry block 110. Cascode-pair NMOS transistors $N_B/N_Bc$, 132/132C are activated through bias voltages $V_{bn}$ 125 (for $N_A$ 134 and $N_B$ 132) and $V_{bnC}$ 125C (for $N_{AC}$ 134C and $N_{BC}$ 132C). The bias voltages $V_{bp}$ 115 and $V_{bpc}$ 115C (for PMOS transistors) generated in the input bias circuitry block 110 are coupled to adaptive biasing circuit block 130 and to V-to-I OTA block 150.

In the example of FIG. 1B, transistors $N_1$ 162, N2 164, N3 182 and the high-side PMOS transistors, are configured as cascade-pair P1/P1C 152/152C, P2/P2C 154/154C, with each being biased to conduct a fixed biasing current $I_b$ 113. Resistor R1 166 (e.g., 200K ohm) is coupled in series with transistor N1 162 with the current flowing through resistor R1 166 fixed at $I_b$ 113. The voltage at V1 163 is thus V1=$I_b$×R1+Vin.

In V-to-I OTA converter block 150 transistors N1 162, N2, 164 and N3 182 are of the same size and carrying the same current $I_b$ 113. As configured, the gate-to-source voltages of these transistors match, resulting in voltages V1 163, V2 165 and V3 185 being substantially equal (V1=V2=V3). Thus, the voltages V1 163, V2 165 and V3 185 all follow input signal $V_{in}$ 145, but appear level shifted up by an offset voltage equal to $I_b$×R1. The level shifted version of $V_{in}$ appears across resistor R2 168 (In one example R2=200K ohm), hence: $I_{R2}$=I3=$V_{in}/R_2$.

The current $I_b$ and resistor R1 166 are set such that V1 163 stays above ground 101 even when $V_{in}$ 145 drops to its largest negative value. Thus, resistor $R_1$ 166 provides a voltage drop between input signal $V_{in}$ 145 and voltage V1 163, such that the source of transistor N1 162 remains above ground 101 even when $V_{in}$<0 V (e.g., due to negative oscillations). The values of current $I_b$ 113 and resistor R1 166 are set so that $I_b$×R1 remains equal to, or higher than, the highest possible negative oscillation of Vin ($I_b$×R1≥−$V_{in}$). This ensures that the sources of transistors N1 162, N2, 164 and N3 182 and the drains of transistors N4 169 and N5 186 stay above a threshold value (e.g., ~0.2 V) even when signal $V_{in}$ is at its maximum negative value.

Persons of skill will appreciate that the current through transistor N2 164 is a fixed value (=$I_b$; e.g., 2.5 µA); however, the current through source resistor R2 168 (e.g., R2=200KΩ) drops in order for voltage V2 165 to follow voltage V1 163 as V1 drops. The way that the circuit of FIG. 1B bleeds off bias current through R2 is by providing a path through transistor N4 169. In one embodiment, transistor N4 169 is biased to carry a fixed current of $I_b$ 113. Transistor N4 169 has a common gate-source coupling with transistor N5 186; therefore it and the current $I_b$ 113 through transistor N5 186. As a result, the bias current through transistor N4 169 is set to the fixed current $I_b$ 113.

In one embodiment, transistors N4 169 and N5 186 are sized to be relatively weak devices, such that they each require a larger gate voltage, which ensures that the drain of transistor N3 182 remains in saturation mode. If voltages V1 163 and V2 165 rise substantially then transistor N3 182 may transition out of saturation and act as a transmission gate. However, in that case the voltages on the drains of transistors N4 169 and N5 186 are large enough to place them into saturation such that the currents flowing through each of transistors N4 169 and N5 186 accurately mirror each other.

Persons of skill in the art will understand that transistor N4 169 takes substantially all of the current I2 sourced by transistor N2 164. This allows voltage V2 165 to drop to 0V. In order for V2 to rise above ground 101, current flow through R2 is supplied by transistor P3 158. Transistor P3 158 is shown coupled in series with diode-connected PMOS transistor P4 156 as part of an active feedback loop that monitors the drain of transistor N2 164.

Note that when input signal $V_{in}$ 145 is at 0 V, voltages V1 163 and V2 165 are matched and equal currents flow through R1 166 and R2 168. If voltage V1 163 rises, voltage V2 165 rises also, with R2 168 receiving current I3. Note further that the mirroring transistor above transistor N2 164 only provides a current equal to $I_b$ 113. This causes the drain of N2 164 to fall, which turns on transistor P3 158 so as to deliver the additional current I3 that flows through R2 168. This additional current flow raises the voltage at V2 165 until it matches voltage at V1 163.

Conversely, as voltage V1 163 drops, voltage V2 165 also drops by gradually turning off transistor P3 158. If voltage V1 163 reaches 0 V, voltage V2 165 is also at 0 V; therefore transistor P3 158 is turned off. In cases where a quick transient response is required, transistor P3 158 is not allowed to turn fully off. This may be achieved by setting the values of $I_b$ 113 and R2 168 such that voltage at node V2 165 does not drop below a minimum threshold (e.g., 0.2V), which means that approximately 1 µA continues to flow through transistor P3 158. It is appreciated that the current that flows through R2 is supplied by transistor P3 158, and not transistor N2 164.

As shown, transistor P3 158 is configured as a source follower which drives the mirroring transistor P4 156 (configured as a diode), with a bias current I3 153 (I3=$I_b$+$V_{in}$/R2) flowing through each device. To obtain a current that reflects $V_{in}$/R2, which is bidirectional depending on the polarity of $V_{in}$ 145, current $I_b$ 113 is subtracted. Subtracting $I_b$ 113 is accurately accomplished by duplicating transistors N3 182 and N5 186, as shown in the schematic of FIG. 1B. In the last (right-most side) current leg of V-to-I OTA block 150 high-side PMOS cascode-pair transistors P5/P5C 176/176C are activated by Vbp/Vbpc 115/115C (provided by input bias circuitry 110) such that biasing current $I_b$ flows through low-side NMOS transistors N3 182 and N5 186.

With continuing reference to FIG. 1B, output current scaling may be achieved by an optional mirroring ratio design (device size ratio) to generate current $I_{out}$ 190 in a scaled linear relationship with input voltage signal $V_{in}$ 145. Low-side NMOS transistors N3a 184 and N5a 188 mirror biasing current $I_b$ 113 from transistors N3 182 and N5 186, which is then subtracted from current I3 in high-side PMOS transistor P6 174 to generate output current $I_{out}$ 190.

To reiterate, the main purpose of adaptive biasing circuitry 130 and resistor R1 166 is to level shift (up) input signal $V_{in}$ 145 via the voltage drop across resistor R1 166 such that sources of transistors N1 162 and N2 164 stay above a minimum threshold (e.g., ~0.2V). It is appreciated that if input signal $V_{in}$ 145 is at its maximum positive value (e.g., ~1 V) then the drain of transistors N1 162 is likewise raised to its maximum value of $V_{in}$+$I_b$×R1+Vgs$_{(N1)}$ which in one embodiment is about: 1 V+(2.5 µA*200 kΩ)+1.8V=3.3V Practitioners will appreciate that adaptive bias circuitry 130 increases the range over which input signal $V_{in}$ 145 can operate by boosting bias current $I_b$ 113 as the input signal $V_{in}$ 145 drops below ground 101 (goes negative). In addition, adaptive biasing circuitry 130 decreases current $I_b$ 113 when $V_{in}$ 145 is greater than its minimum threshold (e.g., $V_{in}$>0.2 V), which reduces the voltage drop across resistor R1 166, thereby increasing the headroom for diode-connected transistor N1 162. This allows the minimum supply voltage to be reduced (by ~0.5 V).

Cascode-pair transistors $N_A/N_{AC}$ 134/134C and $N_B/N_{BC}$ 132/132C are sized to be a fraction of the cascode-pair transistors in input bias circuitry 110, i.e., $N_{in1}/N_{in1C}$ 122/122C and $N_{in2}/N_{in2C}$ 124/124C. As such, transistors $N_A/N_{AC}$ 134/134C and $N_B/N_{BC}$ 132/132C carry relatively little current (a fraction 1/k of $I_b$) when input signal $V_{in}$ 145 is at 0 V. In the embodiment of FIG. 1B the fraction is about 1/k=⅕ (~$I_b$/5). This increases the bias current through the transistors in adaptive bias circuitry 130 slightly, e.g., around 20% higher than the current in the NMOS transistor devices biased by $V_{bn}$ 125 in input bias circuitry 113. As $V_{in}$ 145 rises above ground 101, the current in transistors $N_A/N_{AC}$ 134/134C and $N_B/N_{BC}$ 132/132C shut off, causing the adaptive current contribution to drop to zero. On the other hand, if input signal $V_{in}$ 145 falls below ground ($V_{in}$<0), the current in adaptive bias circuit 130 increases by approximately (0 V–$V_{in}$)/$R_{Bias}$; (in one example $R_{Bias}$=100 KΩ), which can cause bias current $I_b$ 113 to increase more than double as input signal $V_{in}$ 145 drops below ground 101.

In the embodiment of FIG. 1B transistors $N_A/N_{AC}$ 134/134C and $N_B/N_{BC}$ 132/132C are ~⅕ of the size of the NMOS transistors in input bias circuitry 110. Note: transistors $N_{in1}/N_{in1C}$ 122/122C and $N_{in2}/N_{in2C}$ 124/124C are controlled by $V_{bn}$ 125 and $V_{bnC}$ 125C. In other embodiments, a wider size range may be achieved by doubling or tripling the size of transistors $N_{in1}/N_{in1C}$ 122/122C and $N_{in2}/N_{in2C}$ 124/124C, which improves accuracy and allows for a wider signal range for the input voltage signal $V_{in}$ 145.—With an input voltage signal range of: –1 V<$V_{in}$<+1 V an accuracy of +/–1.2% for $I_{out}$ may be achieved.

The above description of illustrated example embodiments, including what is described in the Abstract, are not intended to be exhaustive or to be limitation to the precise forms or structures disclosed. While specific embodiments and examples of the subject matter described herein are for illustrative purposes, various equivalent modifications are possible without departing from the broader spirit and scope of the present invention. Indeed, it is appreciated that the specific example currents, voltages, resistances, device sizes, etc., are provided for explanation purposes and that other values may also be employed in other embodiments and examples in accordance with the teachings of the present invention.

I claim:

1. An integrated circuit (IC) for voltage-to-current conversion comprising:
   bias circuitry coupled to receive one or more input bias voltages referenced to ground, the bias circuitry generating one or more bias voltages;
   an adaptive biasing circuit coupled to receive the one or more input bias voltages and the one or more bias voltages, the adaptive biasing circuit being configured to adaptively shift an input signal having a negative value to a positive value above ground; and
   an operational transconductance amplifier (OTA) coupled to receive a supply bias current and the one or more bias voltages, the OTA having first and second input terminals coupled to the input signal and ground, respectively, the OTA having first and second transistors coupled to the first and second input terminals through first and second resistors at first and second internal nodes, respectively, in operation, the supply bias current flows through each of the first and second transistors, the OTA further including additional circuitry coupled to the second internal node, the additional circuitry being configured to insure that the voltage at the second internal node follows the voltage at the first internal node, the OTA generating an output current signal responsive to a differential input voltage applied across the first and second input terminals.

2. The IC of claim 1 wherein the output current signal is linearly related with the input signal.

3. The IC of claim 1 further comprising a third resistor coupled between the first input terminal and ground, the third resistor having a relatively low resistance value as compared to the first and second resistors.

4. The IC of claim 1 wherein the first and second resistors each have a substantially equal resistance value.

5. The IC of claim 1 wherein the bias circuitry includes first and second switching legs each carrying a substantially equal current in operation, each of the first and second switching legs including high-side cascode structure PMOS transistors coupled in series with low-side cascode structure NMOS transistors, the one or more input bias voltages being coupled to the gates of cascode structure NMOS transistors, and the one or more bias voltages being coupled to the gates of cascode structure PMOS transistors of the first and second switching legs.

6. The IC of claim 5 wherein during operation a voltage drop across the first resistor level shifts the input signal such that sources of the first and second transistors stay above a minimum threshold.

7. The IC of claim 1 wherein the first and second transistors comprise NMOS transistors.

8. The IC of claim 1 wherein the additional circuitry comprises third and fourth transistors, the third transistor being coupled to the second internal node, during operation the third transistor providing current flow through the second resistor, the fourth transistor being coupled between the second internal node and ground, the supply bias current flowing through the fourth transistor.

9. The IC of claim 8 wherein the third transistor comprises a PMOS transistor and the fourth transistor comprises a NMOS transistor.

10. An integrated circuit (IC) or converting a differential input voltage into an output current comprising:
    bias circuitry comprising first and second switching legs, each including high-side transistors coupled in series with low-side transistors, the low-side transistors coupled to receive one or more input bias voltages, the high-side transistors generating one or more bias voltages;
    adaptive biasing circuitry configured to adaptively shift an input voltage signal having a negative value to a positive value above ground; and
    an operational transconductance amplifier (OTA) having a cascode-pair of PMOS transistors coupled to receive the one or more bias voltages, the OTA having first and second input terminals coupled to the input voltage signal and ground, respectively, a difference between the input voltage signal and ground comprising the differential input voltage, the OTA having first and second NMOS transistors coupled to the first and second input terminals through first and second resistors at first and second internal nodes, respectively, in operation, a supply bias current flowing through each of the first and second transistors and through the cascode-pair of PMOS transistors, the OTA being configured to insure that the voltage at the second internal node follows the voltage at the first internal node, the OTA generating an output current signal responsive to a differential input voltage applied across the first and second input terminals.

11. The IC of claim 10 wherein the input voltage signal has a range that extends between positive and negative values.

12. The IC of claim 10 wherein the OTA has an input impedance to ground that is substantially lower than the input impedance to a supply.

13. The IC of claim 10 wherein the high-side transistors and the low-side transistors of the bias circuitry are each configured as a cascode-pair.

14. The IC of claim 10 wherein the first input terminal is coupled to ground through an input resistor having a substantially lower resistance value as compared to the first resistor.

15. The IC of claim 10 where the first and second resistors each have a substantially equal resistance value.

16. The IC of claim 10 wherein the OTA further includes third and fourth transistors, the third transistor being coupled to the second internal node, during operation the third transistor providing current flow through the second resistor, the fourth transistor being coupled between the second internal node and ground, the supply bias current flowing through the fourth transistor.

17. The IC of claim 16 wherein the third transistor is a PMOS transistor and the fourth transistor is a NMOS transistor.

18. The IC of claim 17 herein the third transistor is coupled to a supply bus through a diode.

19. The IC of claim 10 wherein the output current signal has a scaled linear relationship with the input voltage signal.

* * * * *